United States Patent
Kawamura

(10) Patent No.: US 8,264,891 B2
(45) Date of Patent: Sep. 11, 2012

(54) ERASE METHOD AND NON-VOLATILE SEMICONDUCTOR MEMORY

(75) Inventor: Shoichi Kawamura, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 408 days.

(21) Appl. No.: 12/535,903

(22) Filed: Aug. 5, 2009

(65) Prior Publication Data

US 2010/0034026 A1 Feb. 11, 2010

(30) Foreign Application Priority Data

Aug. 6, 2008 (JP) .................................. 2008-203422
Jul. 27, 2009 (KR) .......................... 10-2009-0068260

(51) Int. Cl.
*G11C 11/34* (2006.01)
*G11C 16/04* (2006.01)

(52) U.S. Cl. ......... 365/185.33; 365/185.19; 365/185.27; 365/185.29

(58) Field of Classification Search ............. 365/185.19, 365/185.29, 185.33
See application file for complete search history.

(56) References Cited

U.S. PATENT DOCUMENTS

| | | | | |
|---|---|---|---|---|
| 5,297,148 A | * | 3/1994 | Harari et al. | 714/710 |
| 5,509,018 A | * | 4/1996 | Niijima et al. | 714/710 |
| 6,870,771 B2 | * | 3/2005 | Tomoeda et al. | 365/185.22 |
| 7,001,808 B2 | * | 2/2006 | Tsukamoto et al. | 438/257 |
| 7,872,917 B2 | * | 1/2011 | Kawamura | 365/185.2 |
| 2008/0007999 A1 | * | 1/2008 | Park et al. | 365/185.02 |

FOREIGN PATENT DOCUMENTS

| | | |
|---|---|---|
| JP | 08077782 A | 3/1996 |
| JP | 2000348492 A | 12/2000 |

* cited by examiner

*Primary Examiner* — Tuan T Nguyen
*Assistant Examiner* — Lance Reidlinger
(74) *Attorney, Agent, or Firm* — Volentine & Whitt, PLLC

(57) ABSTRACT

An erase method for a non-volatile memory device having a defined erase unit divided into first and second inner erase units includes; applying an erase voltage to at least one of the first and second inner erase units in accordance with respective states of corresponding first and second fail flags, after applying the erase voltage to the at least one of the first and second inner erase units, performing an erase verification on the at least one of the first and second inner erase units, and updating the at least one of the first and second fail flags in accordance with erase verification results.

9 Claims, 5 Drawing Sheets

Fig. 3

| Unit A | Unit B | BLK 0 |
|--------|--------|-------|
| Unit A | Unit B | BLK 1 |
| Unit A | Unit B | BLK 2 |
| ⋮ | ⋮ | ⋮ |
| Unit A | Unit B | BLK 255 |

ERASE METHOD AND NON-VOLATILE SEMICONDUCTOR MEMORY

CROSS-REFERENCE TO RELATED APPLICATIONS

This U.S. non-provisional patent application claims priority under 35 U.S.C. §119 to Japanese Patent Application No. 10-2008-203422 filed on Aug. 6, 2008, and to Korean Patent Application No. 10-2009-0068260 filed on Jul. 27, 2009, the subject matter of which are hereby incorporated by reference.

BACKGROUND

The present disclosure relates to an erase method for non-volatile semiconductor memory devices. More particularly, the disclosure relates to an erase method for NOR flash memory devices.

NOR flash memory is a well known type of non-volatile memory capable of retaining stored data in the absence of applied power, yet also capable of being electrically erasable and electrically programmable. One conventional approach to the implementation of an erase method for nonvolatile memory is disclosed, for example, in Japan Patent Publication Nos. 2000-348492 and H8-77782. The conventional approach variously describes a block erase mode, a multi block erase mode, and a chip erase mode.

An erase operation performed by a NOR flash memory is typically conducted on the basis of a defined "erase unit", (i.e., a memory block size capable of being erased during a single erase operation). Emerging NOR flash memory devices are characterized by an increasing erase unit size. That is, where previous NOR flash memory had an erase unit of 0.5 M, emerging NOR flash memory has an erase unit of 2.0 M. This expansion of erase unit size follows an increase in the number of NOR flash memory devices incorporating multi level memory cells (MLCs). The incorporation of MLCs allows contemporary NOR flash memory to store more data per unit area of constituent chip size.

To accommodate an increasing erase unit size for NOR flash memory incorporating MLCs, the number of physical memory cells conditioned by an erase operation must be increased. For example, in order to realize an erase unit of 2.0 M in a NOR flash memory incorporating MLCs, the number of inner physical memory cells should be 1.0 M which is twice the conventional number of memory cells.

However, increasing the number of physical memory cells conditioned by an erase operation raises some difficult issues. Some of these issues will now be described using an assumption that the number of physical memory cells being conditioned in 1.0 M. First, because the number of physical memory cells is now double that of previous conventional NOR flash memory devices, the threshold voltage distribution (Vt distribution) for the 1.0 M memory cells may broaden following completion of an erase operation, as compared with the threshold voltage distribution for 0.5 M memory cells. FIG. 5 graphically illustrates this phenomenon. The results illustrated in FIG. 5 occur immediately after an erase operation is completed, but before "treatment" of the memory cells which is typical in erase operations for flash memory.

As is conventionally understood, it is necessary to prevent an over-erase condition for memory cells in NOR flash memory. Once the threshold voltage distribution has broadened, it is necessary to suppress the incidence rate of over-erase by raising the reference voltage used during erase verification. However, this means that the upper limit of the threshold voltage for an erased memory cell must be increased, thereby decreasing read margin for the memory cell.

Thus, in order to realize an erase threshold voltage distribution similar to that previously obtained for 0.5 M memory cells, an erase operation applied to 1.0 M memory cells must carefully consider the erase verification process and possibly adjustments to the memory cell fabrication process. Further, the prompt application of certain conventional suppression techniques becomes complicated.

It is further assumed, consistent with conventional practice, that the 1.0 M memory cells may be erased as two (2) 0.5 M memory cell units connected in series. In such a case, the use of conventional suppression techniques becomes possible with an erase threshold voltage distribution width typical for 0.5 M memory cells. Furthermore, since a conventionally similar erase operation may be used for each of the two 0.5 M memory cell units, potential alteration of the fabrication process is not required.

However, the serial erasure of two 0.5 M memory cell units unduly extends the time required to erase the entire 1.0 M memory cells using conventional techniques.

SUMMARY

Embodiments of the invention provide an erase method for a non-volatile semiconductor memory device in which erase threshold voltage distribution for the constituent memory cells is similar to that of much smaller erase units (e.g., 0.5 M memory cells), yet without an material expansion in the amount of time required to perform an erase operation.

Embodiments of the invention provide an erase method for a non-volatile memory device having a defined erase unit divided into first and second inner erase units, the method comprising; applying an erase voltage to at least one of the first and second inner erase units in accordance with respective states of corresponding first and second fail flags, after applying the erase voltage to the at least one of the first and second inner erase units, performing an erase verification on the at least one of the first and second inner erase units, and updating the at least one of the first and second fail flags in accordance with erase verification results.

Embodiments of the invention also provide a non-volatile memory device, comprising; an array of memory cell arranged in a plurality of erase unit blocks according to a defined erase unit, wherein each one of the plurality of erase unit blocks is divided into first and second inner erase units, a first well region containing the memory cells corresponding to the first inner erase unit and a second well region containing the memory cells corresponding to the second inner erase unit, wherein the first and second well regions are electrically separated on a semiconductor substrate.

Embodiments of the invention also provide a non-volatile memory device, comprising; an array of memory cell arranged in a plurality of erase unit blocks according to a defined erase unit, wherein each one of the plurality of erase unit blocks is divided into first and second inner erase units, a common well region containing the memory cells corresponding to the first and second inner erase units, a first group of word lines corresponding to the memory cells of the first inner erase unit arranged on the well region, and a second group of word lines corresponding to the memory cells of the second inner erase unit arranged on the well region, wherein the first and second word lines are configured for independent application of a bias voltage during an erase operation, such that the first and second inner erase units may be erased and erased verified during the erase operation.

BRIEF DESCRIPTION OF THE DRAWINGS

The accompanying drawings illustrated certain embodiments of the present invention. In the figures:

FIG. 3 is a conceptual view of a memory cell array structure for a NOR flash memory incorporating the flash memory cell of FIG. 2;

DESCRIPTION OF EMBODIMENTS

Hereinafter, exemplary embodiments of the present invention will be described in some additional detail with reference to the accompanying drawings.

Figure 2:
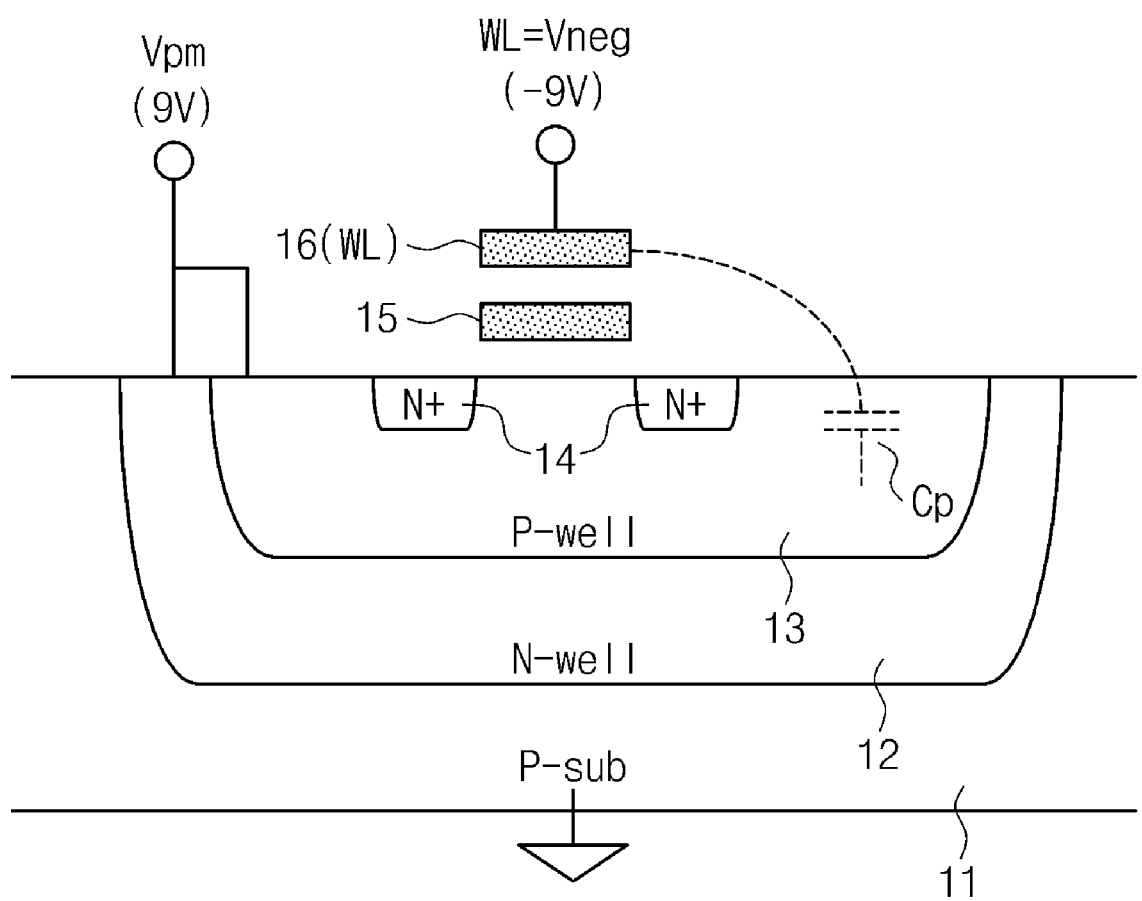
FIG. 2 is a sectional view of a flash memory cell and its voltage bias conditions during an erase operation.

FIG. 2 is a sectional structure of a flash memory cell as biased during an erase operation according to an embodiment of the invention. The flash memory cell comprises; an N-well 12 and a P-well 13 successively are formed in a P-type substrate 11. Source/drain regions 14 for the flash memory cell are formed in the P-well 13. Moreover, a floating gate 15 and a control gate 16 are stacked on the P-well 13 between the source/drain regions 14. The control gate 16 is connected to a word line WL.

In a NOR flash memory cell having the above structure, a negative voltage Vneg (~−9V) is applied from a charge pump to the word line WL during an erase operation, and a positive voltage Vpm (~+9V) is applied from another charge pump to the well regions 12 and 13. Under these bias conditions, electrons accumulated on the floating gate 15 migrate to the well regions 12 and 13 under the influence of a well understood phenomenon called FN tunneling. In this manner, data is erased from the NOR flash memory cell. During a subsequently performed erase verification, a reference voltage greater than the threshold voltage of the erased cell is applied to the word line WL to essentially perform a read operation. By means of this read operation it is determined whether or not the erase operation has been successfully performed. If the erase verification fails, then the erase operation is repeated.

FIG. 3 is a conceptual plan view of a memory cell array for a NOR flash memory including a plurality of the above-mentioned flash memory cells. As is conventionally understood, the memory cell array includes a plurality of word lines, a plurality of bit lines, and the plurality of memory cells connected thereto. In the illustrated example of FIG. 3, the memory cell array is operationally divided into (e.g.,) 256 units in relation to an arbitrarily determined "block erase unit." However, this block erase unit is further divided according to a smaller "inner erase unit." Returning to the example of a defined block erase unit of 1.0 M memory cells, a NOR flash memory implemented in accordance with an embodiment of the invention might internally realize the 1.0 M black erase unit in two inner erase units (e.g., unit A and unit B), wherein each inner erase unit is 0.5 M memory cells.

Moreover, consistent with the illustrated embodiment of the present invention shown in FIG. 3, the following erase method may be used during an erase operation.

(1) An erase voltage is simultaneously applied to first (unit A) and second (unit B) inner erase units.

(2) Erase verification is then performed in series for each erase unit.

(3) Once an erase verification failure is detected in a first (unit A) inner erase unit, the ongoing erase verification for said inner erase unit is halted, a flag indicating an erase verification fail is stored in a corresponding memory unit, and the erase verification for a corresponding second (unit B) inner erase unit is begun.

(4) Thus, erase verification for the second (unit B) inner erase unit is performed. If an erase verification failure is detected, the erase verification is halted, and a flag indicating the erase verification failure is stored in the memory unit.

(5) Since the erase verifications for both inner erase units have failed, a defined erase voltage is applied to both inner erase units based on the stored fail flags.

(6) The foregoing erase verification steps are repeated, and
 (a) during this repetition, if the erase verification for the first (unit A) inner erase unit fails at a certain point and thereafter the erase verification for the second (unit B) inner erase unit passes, a defined erase voltage is applied to only the first (unit A) inner erase unit, or
 (b) during this repetition, if the erase verification for the first (unit A) inner erase unit passes at a certain point and thereafter the erase verification for the second (unit B) inner erase unit fails, a defined erase voltage is applied to only the second (unit B) inner erase unit.

(7) This approach continues until erase verifications for both inner erase units of each erase unit pass. However, passed erase units (having passed first and second inner erase units) are skipped during subsequent erase verification steps.

Figure 1:
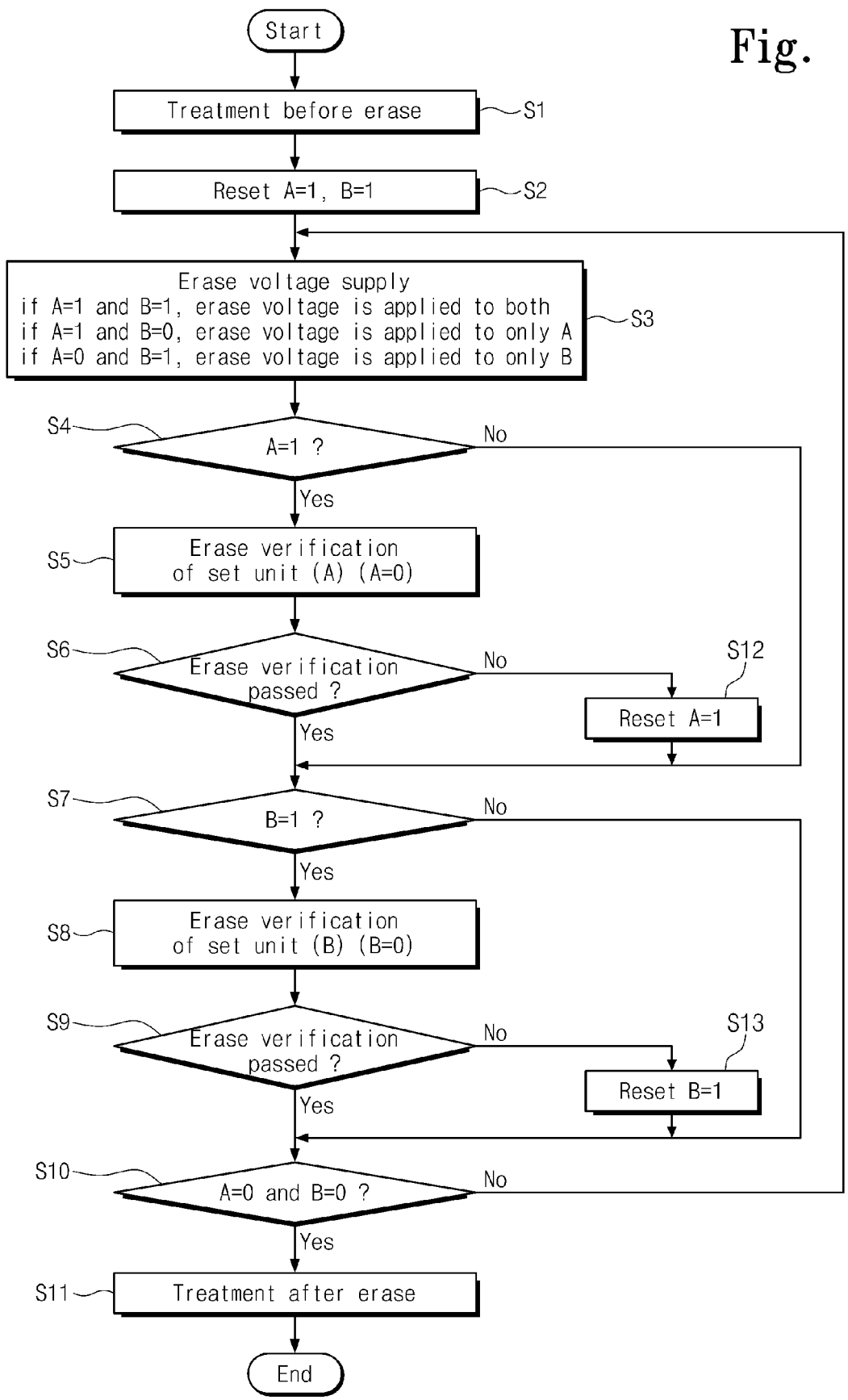
FIG. 1 is a flowchart summarizing an erase method according to an embodiment of the invention.

FIG. 1 is a flowchart summarizing in one embodiment of the invention the above-described approach. Using conventional techniques, treatment of the memory cells before erase may be performed (S1). Fail flags are then initialized (reset) in the memory unit (S2). In the illustrated example, two (2) inner erase units are assumed and corresponding fail flags are reset to A=1 and B=1 in the memory unit.

An erase/verification loop now begins with the fail flag conditional application of an erase voltage to one or both of the inner erase units for a current erase unit (e.g., BLK 0 in FIG. 3) (S3). Since A=1 and B=1 in the initialization state (S2), the erase voltage is applied to both first and second inner units (A and B) and a corresponding erase operation is performed.

A verification determination is now made for the first inner erase unit (A) (S4). If the corresponding "first" fail flag is reset (A=1) (S4=yes), then the first fail flag is set (A=0) in the memory unit and an erase verification is performed for the first inner erase unit (A) (S5). The fail flag set and erase verification may be performed in parallel.

If the first inner erase unit (A) passes erase verification (S6=yes), then a verification determination is made for the second inner erase unit (B) (S7). However, if the first inner erase unit (A) fails erase verification, the first fail flag is again reset (A=1) (S12), before performing the verification determination for the second inner erase unit (B) (S7).

Here again the verification determination relative to the second inner erase unit (B) is made in view of a corresponding "second" fail flag status. If the second fail flag is reset (A=1) (S7=yes), then the second fail flag is set (B=0) in the memory unit and an erase verification is performed for the second inner erase unit (B) (S8). Again, the fail flag set and erase verification may be performed in parallel.

If the second inner erase unit (A) passes erase verification (S9=yes), then a composite verification determination is made for both the first and second inner erase units (A and B) (S10). However, if the second inner erase unit (B) fails erase verification, the second fail flag is again reset (B=1) (S13), before performing the composite verification determination (S10).

If every inner erase unit (e.g., A and B) for the current erase unit (e.g., BLK 0) has passed erase verification (S10=yes), the treatment of the memory cells post erasure (S11) may be performed, before the erase operation is completed.

However, where one or more of the inner erase unit (A and/or B) has not passed verification, the erase operation returns to the application of the erase voltage (S3), and the erase/verification loop continues.

Where a set fail flag for an inner erase unit (A=0 or B=0) indicates that the corresponding inner erase unit has passed (S4=no or S7=no), a corresponding verification step is omitted.

The embodiment of the invention illustrated in FIG. 1 provides the following:

(1) An erase verification is performed on each inner erase unit (A or B) in accordance with the value of a corresponding fail flag result. Each successively applied erase voltage may be modified (i.e., increased) over the previous erase/verification loop. Thus, conventionally similar erase/verification techniques may be used despite a larger defined erase unit size. For example, again returning to the emerging 1.0 M memory cells requirement verses the 0.5 M memory cells convention, the same type of read operation may be used during the erase verification step as have been applied to the 0.5 M memory cells convention with similar effects of erase threshold voltage distribution.

(2) Since the erase voltage may be simultaneously applied to respective inner erase units within multiple erase units (e.g., BLK 0 through BLK 255 of FIG. 3) it is possible to erase multiple erase blocks, each having a (2×) expanded erase unit size, in about the same time as was conventionally required.

(3) Since the foregoing method uses similar erase/verification techniques as compared with conventional NOR flash memory devices, current manufacturing processes are applicable without modification.

In addition, an erase method that further divides a defined erase unit into a plurality of inner erase units for controlling application of an erase voltage allows; (a) each well region containing a memory cell array for each erase unit to be separated and independently controlled, (b) each well region containing a memory cell array is shared, but a word line may be separately controlled for each erase unit, and (c) each well region containing a memory cell array may be separated by an erase unit and independently controlled, and a word line is independently controlled by an erase unit.

Figure 4:
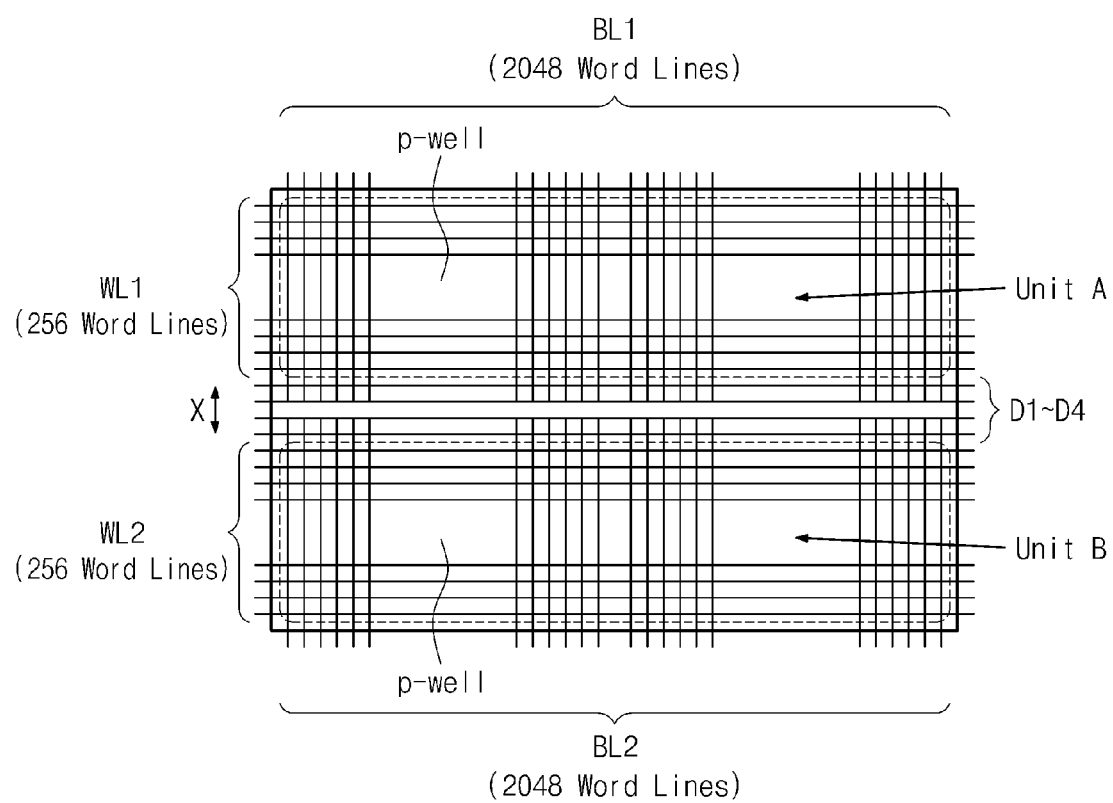
FIG. 4 is a partial plan view of a memory cell array to which an erase method according to an embodiment of the invention is applied.
Figure 5:
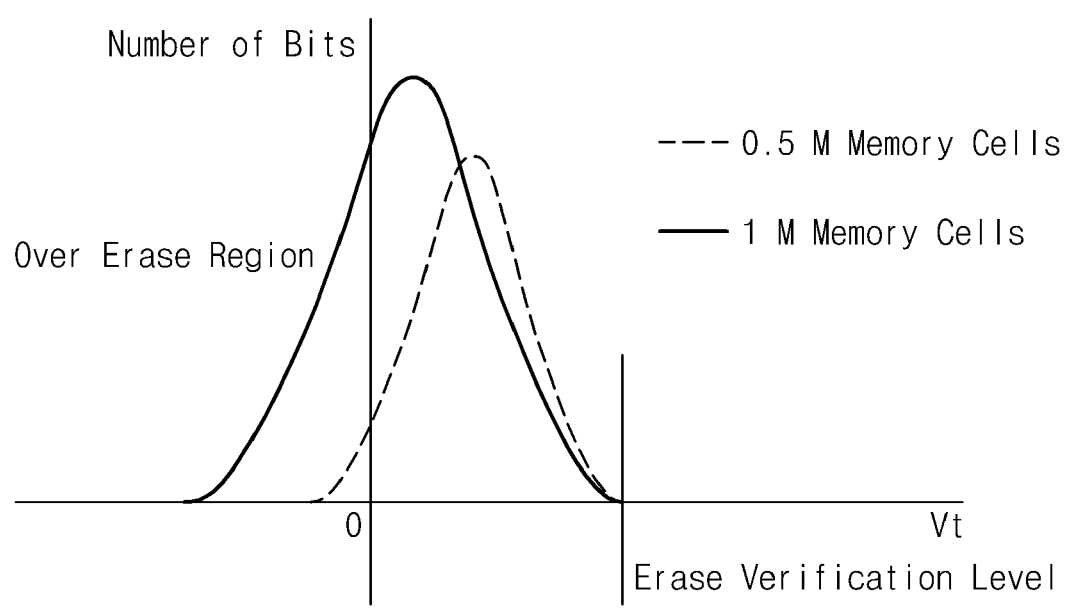
FIG. 5 illustrates threshold voltage distribution characteristics for memory cells.

FIG. 4 is a plan view further illustrating a method of separating an erase unit into a plurality of inner erase units according to an embodiment of the invention. This example again assumes an erase unit of about 1.0 M memory cells. Consistent with FIG. 2, a common P-well region is used for each one of the inner erase units forming the larger erase unit. Four dummy word lines D1 to D4 are disposed between adjacent P-well regions along a horizontal (or row, or word line) axis. Using the dummy word lines D1 to D4 as a boundary, a first group (WL1) of 256 word lines corresponding to the first (unit A) inner erase unit is disposed to one side of (e.g., "above") the dummy word lines. A second group (WL2) of 256 word lines corresponding to the second (unit B) inner erase unit is disposed to the other side of the dummy word lines. Additionally, bounded by the dummy word lines D1 to D4, a first group (BL1) of 2048 bit lines corresponding to the first (unit A) inner erase unit extends across the corresponding P-well region, and a second group (BL2) of 2048 bit lines corresponding to the second (unit B) inner erase unit extends across the other corresponding P-well region.

Instead of independently controlled, electrically separated P-well regions for the respective inner erase units, a common P-well region may be used, but corresponding word line voltages will be independently controlled during an erase operation.

Embodiments of the invention have been described in the context of a NOR flash memory, but other embodiments of the invention encompass NAND flash memory.

According to the foregoing erase methods for non-volatile semiconductor memory devices, an erase unit structure and corresponding erase/verification method may be adopted to deal with an expanded erase unit size, without the need of changing the manufacturing processes for the device. Nonetheless, erase threshold voltage distribution and erase time can remain almost the same as for devices defining a smaller erase unit size.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A non-volatile memory device including a semiconductor substrate and comprising:
   an array of memory cells divided into a plurality of erase units, wherein each one of the plurality of erase units includes a group of memory cells arranged according to a contiguous set of word lines and capable of being erased during a single erase operation, and an erase unit among the plurality of erase units comprises a first inner erase unit arranged according to a contiguous first subset word line in the set of word lines, and a second inner erase unit arranged according to a contiguous second subset of word line in the set of word lines;
   a first well region disposed in the semiconductor substrate and containing memory cells of the first inner erase unit connected to the first subset of word lines, and a second well region disposed in the semiconductor substrate and containing memory cells of the second inner erase unit connected to the second subset of word lines,
   wherein the first and second well regions are electrically isolated within the semiconductor substrate.

2. The non-volatile memory device of claim 1, wherein each one of the first and second well region is configured for independent application of a bias voltage during an erase operation.

3. The non-volatile memory device of claim 2, further comprising:
   a set of dummy word lines interposed between the first subset of word lines and the second subset of word lines.

4. The nonvolatile memory claim 1, wherein each one of the first and second inner erase units is equal in size.

5. A method of performing an erase operation for a non-volatile memory device including an array of memory cells divided into a plurality of erase units, wherein each one of the plurality of erase units includes memory cells arranged according to a contiguous set of word lines that is capable of being erased as a single unit during the erase operation, and consists of a first inner unit and a second inner unit having the same size, the method comprising:

simultaneously applying an erase voltage to the first and second inner erase units by applying a first bias voltage to a first well region of a semiconductor substrate containing memory cells of the first inner erase unit connected to a first subset of the set of word lines, and a second well region of the semiconductor substrate containing memory cells of the second inner erase unit connected to a second subset of the set of word lines;

after simultaneously applying the erase voltage to the first and second inner erase units, performing an erase verification on the first and second inner erase units; and thereafter, upon determining that the first inner erase unit has passed the erase verification, applying the erase voltage to only the second inner erase unit.

6. The method of claim 5, further comprising:
before initially simultaneously applying the erase voltage to the first and second inner erase units, resetting a first fail flag indicating whether the first inner erase unit has passed the erase verification and a second fail flag indicating whether the second inner unit has passed the erase verification.

7. The method of claim 6, further comprising:
upon determining that the second inner erase unit has passed the erase verification, setting the second fail flag; and thereafter,
in response to set states for the first and second fail flags, terminating the erase method.

8. The method of claim 5, further comprising:
upon determining that first inner erase unit has passed the erase verification, setting the first fail flag, such that the applying of the erase voltage to only the second inner erase unit is controlled by the respective states of the first fail flag and the second fail flag.

9. The method of claim 8, further comprising:
after applying the erase voltage to only the second inner erase unit, performing the erase verification on only the second inner erase unit in response to the set state of the first fail flag and the reset state of the second fail flag.

* * * * *